United States Patent
Minervini

(10) Patent No.: US 7,633,156 B2
(45) Date of Patent: *Dec. 15, 2009

(54) ACOUSTIC TRANSDUCER MODULE

(75) Inventor: Anthony D. Minervini, Palos Hills, IL (US)

(73) Assignee: Knowles Electronics, LLC, Itasca, IL (US)

(*) Notice: Subject to any disclaimer, the term of this patent is extended or adjusted under 35 U.S.C. 154(b) by 0 days.

This patent is subject to a terminal disclaimer.

(21) Appl. No.: 12/112,970

(22) Filed: Apr. 30, 2008

(65) Prior Publication Data

US 2008/0217766 A1 Sep. 11, 2008

Related U.S. Application Data

(63) Continuation of application No. 11/117,134, filed on Apr. 28, 2005, now Pat. No. 7,382,048, which is a continuation-in-part of application No. 10/788,181, filed on Feb. 26, 2004.

(60) Provisional application No. 60/450,569, filed on Feb. 28, 2003.

(51) Int. Cl.
*H01L 23/34* (2006.01)
*H04M 1/00* (2006.01)

(52) U.S. Cl. .................... 257/723; 257/730; 455/575.1; 379/429

(58) Field of Classification Search ............... None
See application file for complete search history.

(56) References Cited

U.S. PATENT DOCUMENTS 2,417,153 A 3/1947 Darr (Continued)

FOREIGN PATENT DOCUMENTS

FI 981413 12/1999

(Continued)

OTHER PUBLICATIONS

International Search Report for Application No. PCT/06/010077 dated Jun. 23, 2006.

(Continued)

*Primary Examiner*—Alonzo Chambliss
(74) *Attorney, Agent, or Firm*—Fitch, Even, Tabin & Flannery

(57) ABSTRACT

A module (100, 200, 300, 400, 500, 600, 900) may be electrically connected to a PCB (18, 918) residing in a device (14) or may be joined to the device (14) to form a portion of the housing (16, 916) of the device (14). The module may include a housing (102, 202, 302, 402, 502, 602) having at least one layer, a surface mountable component, such as a surface mountable acoustic transducer (110, 210, 310, 410, 510, 610, 910) having a connecting surface (114, 214, 314, 414, 514, 614, 914), and at least one acoustic port (124, 224, 324, 424, 524, 624, 924) to couple a surface of the surface mountable acoustic transducer to the exterior of the device (14). The module (100, 200, 300, 400, 500, 600, 900) may further include a secondary mounting structure (654) electrically connected to the connecting surface (114, 214, 314, 414, 514, 614, 914) of the surface mountable acoustic transducer (110, 210, 310, 410, 510, 610, 910). The acoustic port (124, 224, 324, 424, 524, 624, 924) may include a layer of an environmental barrier (450, 550).

9 Claims, 9 Drawing Sheets

U.S. PATENT DOCUMENTS

| | | |
|---|---|---|
| 2,718,563 A | 9/1955 | Nicholides |
| 4,023,562 A | 5/1977 | Hynecek et al. |
| 4,418,248 A | 11/1983 | Mathis |
| 5,101,543 A | 4/1992 | Cote et al. |
| 5,459,368 A | 10/1995 | Onishi et al. |
| 5,659,195 A | 8/1997 | Kaiser et al. |
| 5,729,605 A | 3/1998 | Bobisuthi et al. |
| 5,790,679 A | 8/1998 | Hawker et al. |
| 5,870,482 A | 2/1999 | Loeppert et al. |
| 5,889,872 A | 3/1999 | Sooriakumar et al. |
| 5,923,750 A | 7/1999 | Enting et al. |
| 5,982,882 A | 11/1999 | Kasbekar et al. |
| 6,002,949 A | 12/1999 | Hawker et al. |
| 6,017,225 A | 1/2000 | Michiya et al. |
| 6,144,738 A | 11/2000 | Hawker et al. |
| 6,178,249 B1 * | 1/2001 | Hietanen et al. ............ 381/174 |
| 6,201,307 B1 | 3/2001 | Terashi et al. |
| 6,358,106 B1 | 3/2002 | Herrera |
| 6,374,120 B1 | 4/2002 | Krauss |
| 6,522,762 B1 | 2/2003 | Mullenborn et al. |
| 6,621,392 B1 | 9/2003 | Volant et al. |
| 6,658,110 B1 | 12/2003 | Andersen |
| 6,781,231 B2 * | 8/2004 | Minervini .................. 257/704 |
| 7,092,745 B1 | 8/2006 | D'Souza |
| 7,382,048 B2 * | 6/2008 | Minervini .................. 257/723 |
| 2001/0012371 A1 | 8/2001 | Baumhauer et al. |
| 2002/0028693 A1 | 3/2002 | Johnson |
| 2002/0102004 A1 | 8/2002 | Minervini |
| 2004/0046245 A1 | 3/2004 | Minervini |
| 2004/0184632 A1 | 9/2004 | Minervini |
| 2005/0069164 A1 | 3/2005 | Muthuswamy et al. |
| 2005/0105749 A1 | 5/2005 | Niederdrank et al. |
| 2006/0115102 A1 | 6/2006 | Mullenborn et al. |
| 2006/0116180 A1 | 6/2006 | Minervini |

FOREIGN PATENT DOCUMENTS

| | | |
|---|---|---|
| JP | 07-099420 | 4/1995 |
| JP | 09-107192 | 4/1997 |
| JP | 09-318650 | 12/1997 |
| JP | 2000-165999 | 6/2000 |
| JP | 2000-277970 | 10/2000 |
| JP | 2000-316042 | 11/2000 |
| WO | WO-01/19133 A1 | 3/2001 |
| WO | WO-01/48462 A1 | 7/2001 |
| WO | WO-2006/020478 A1 | 2/2006 |
| WO | WO-2006/061058 A1 | 6/2006 |

OTHER PUBLICATIONS

International Search Report and Written Opinion for Application No. SG 200717007-9 dated Jan. 14, 2009.

* cited by examiner

ACOUSTIC TRANSDUCER MODULE

CROSS-REFERENCE TO RELATED PATENT APPLICATIONS

This patent is a continuation of U.S. application Ser. No. 11/117,134 filed Apr. 28, 2005, which is a continuation-in-part of U.S. application Ser. No. 10/788,181 filed Feb. 26, 2004, which claims the benefit of U.S. Provisional Patent Application No. 60/450,569, filed Feb. 28, 2003, the disclosures of which are hereby incorporated by reference in their entirety for all purposes.

TECHNICAL FIELD

This patent relates to transducer modules used in communication devices, audio devices or the like, and more particularly, to micro-electromechanical systems (MEMS) miniature silicon condenser microphone modules.

TECHNICAL BACKGROUND

Mobile communication technology advancements have progressed rapidly in recent years. Consumers are increasingly using mobile communication devices such as cellular phones, web-enabled cellular telephones, Personal Digital Assistants (PDA), hand-held computers, laptops, tablets or any other device types that are capable of communication over public or private communication networks. The deployment of more cellular networks especially and the technological advancements in mobile communication technology have resulted in more consumers using mobile communications devices driving improvements in the manufacturing processes, power consumption, reception, fabrication, and miniaturization of the audio devices. As the size of mobile communication devices becomes smaller, ever-increasing demands are placed upon improving the inherent performance of the miniature transducer modules that are utilized.

Generally speaking, conventional electret condenser microphones (ECM) have been used for communication devices such as cellular phones, web-enabled phones, Personal Digital Assistants (PDA), hand-held computers, laptops, tablets or other such devices. In these communication devices, such as cellular telephones, a connector member electrically connects an electret condenser microphone to a printed circuit board fixed within a device housing. The connector may include a gasket between the ECM and the outer housing that is formed with an aperture or port to provide an acoustic path from outside the housing to the ECM. The final assembly of the ECM and the connector with gasket onto the PCB within the housing must be done either manually or with off-line equipment resulting in considerable yield loss due to either poor electrical connections or a poor (leaky) acoustic connection. Soldering of the ECM is not possible due to temperature limitations of the materials used to construct it.

DETAILED DESCRIPTION

Figure 1:
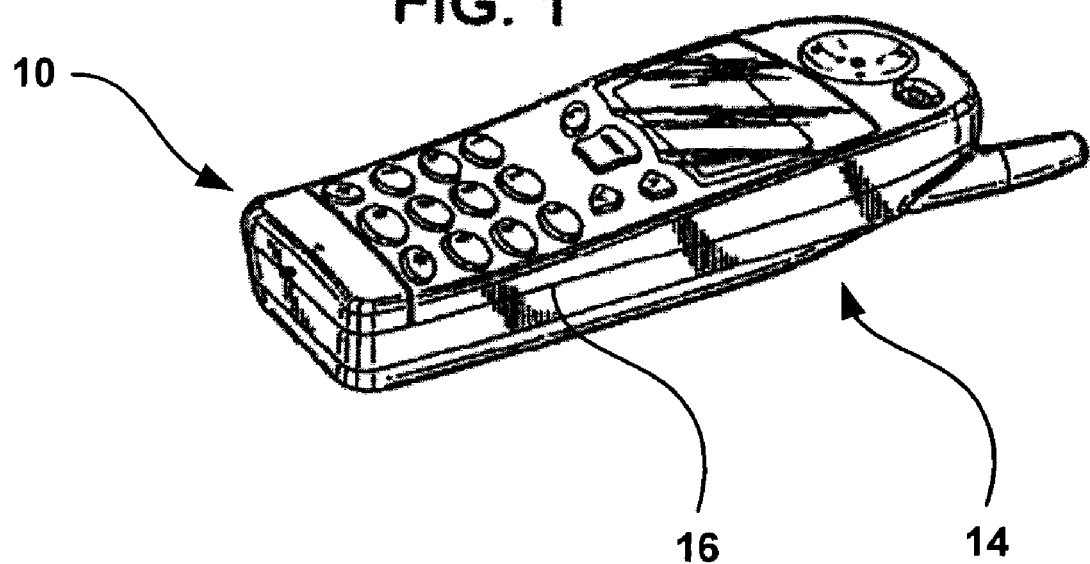
FIG. 1 is a perspective view of a cellular phone incorporating a condenser microphone module in accordance with the described embodiments.

While this patent is susceptible to various modifications and alternative forms, certain embodiments are shown by way of example in the drawings and these embodiments will be described in detail herein. It should be understood, however, that this disclosure is not intended to limit the invention to the particular forms described, but to the contrary, the invention is intended to cover all modifications, alternatives, and equivalents falling within the spirit and scope of the invention defined by the appended claims.

Embodiments of the invention described herein overcome assembly and performance problems associated with previous designs to provide a simple, efficient and economic way and method of manufacturing an acoustic transducer module, such as a microphone module for use with communications devices. The many features and advantages of the invention include providing a reliable electrical connection and a reliable, leak free, acoustic connection. In various embodiments, the invention uses a micro-electromechanical system (MEMS) device, e.g., a transducer and/or silicon-based microphone for use with communication devices.

As will be appreciated from the following description of embodiments, an acoustic transducer module includes a housing and a surface mounted acoustic transducer disposed within the housing. The surface mounted acoustic transducer may have a surface for electrically coupling the surface mounted acoustic transducer to a printed circuit board. The surface is exposed externally of the housing. An acoustic pathway couples the surface mounted acoustic transducer to an exterior surface of the housing.

The surface mounted acoustic transducer may be received within a cavity formed within the housing and secured therein, for example, by mechanical fasteners, friction and mutually engaging mechanical elements. Alternatively, the surface mounted acoustic transducer is secured by bonding or in situ molded within the housing.

The housing may include a first housing member and a second housing member. The first housing member may be an inner housing layer and the second housing member may be an outer housing layer. An intermediate layer may be disposed between the first housing layer and the second housing layer. The first housing layer and the second housing layer may each be non-conductive and the intermediate layer may be a conductive layer.

A barrier may be disposed within the acoustic pathway. The barrier may be a polymeric material film or a sintered metal. For example, the barrier may be an environmental barrier and/or an acoustic resistive barrier. That is, the barrier may be an acoustic resistant material such as a flat plastic sheet or file, e.g., a polytetrafluoroethylene (PTFE) film. The barrier may also be a sintered metal member or a screen.

The housing may include a retaining structure adjacent the connecting surface. The retaining structure may be sized to receive an extension portion of a printed circuit board of an electronic device.

The housing may include a mounting structure. The mounting structure is configured to engage a complimentary mounting structure formed on an electronic device for securing the acoustic transducer module to the electronic device. A secondary mounting structure may also be provided to electrically couple the surface mounted acoustic transducer to an electronic device.

The surface mounted acoustic transducer may be a miniature silicon condenser microphone.

An electronic device may include a housing and a printed circuit board secured within the housing. An acoustic transducer housing is also provided and a surface mounted acoustic transducer is disposed within the acoustic transducer housing. The surface mounted acoustic transducer may have a surface for electrically coupling the surface mounted acoustic transducer to the printed circuit board, the surface being exposed externally of the acoustic transducer housing. At least one acoustic pathway couples the surface mounted acoustic transducer to an exterior surface of the housing. The acoustic transducer housing is secured to the housing and surface being in contact with the printed circuit board to electrically couple the surface mounted acoustic transducer to printed circuit board. The electronic device may be a cellular telephone, a personal digital assistant, a pager, a laptop computer or a portable web browser. The acoustic transducer housing may be bonded to, mechanically secured to or in situ molded within the housing, and the acoustic transducer housing may have a surface forming a portion of a surface of the housing.

Figure 2:
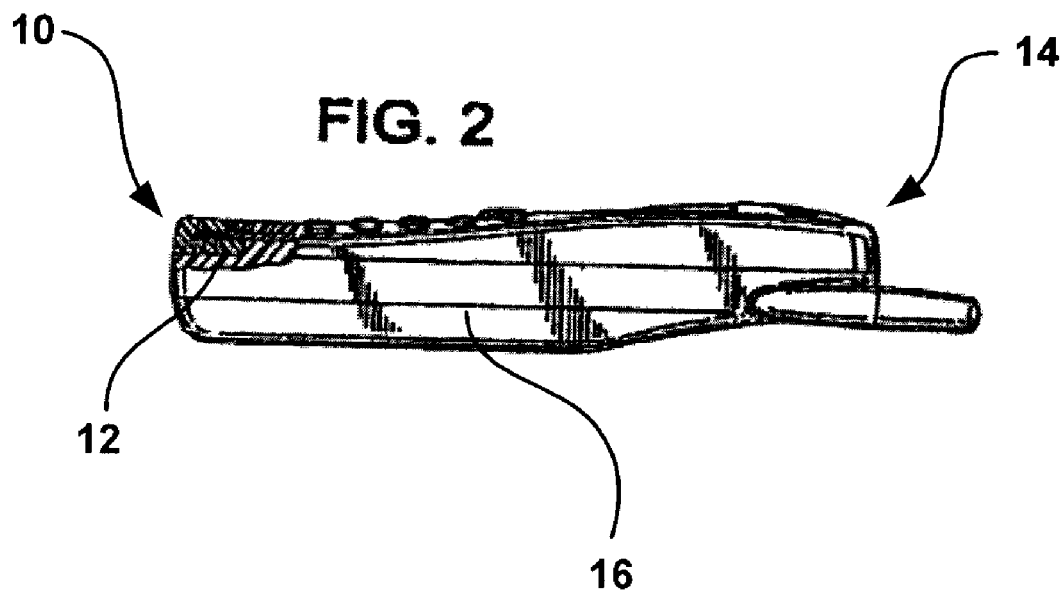
FIG. 2 is a partial cross-sectional view of the cellular phone of FIG. 1.

Referring to FIGS. 1-2, a silicon condenser microphone module is shown generally at numeral 10. The module 10 is electrically connected to a printed circuit board (PCB) 12 residing in a hand-held wireless communication device 14, such as a cellular phone. Of course the module 10 may be adapted for use in virtually any other type of electronic device, including web-enabled phones, personal digital assistant (PDA) devices, other types of portable computing and Internet access appliances and devices, and the like, that may also be capable of communication over public or private communication networks. As explained in greater detail below, the module 10 may be mated with the device 14. Alternately, the module 10 may be joined to the device 14 to form a portion of its outer housing 16.

Figure 3A:
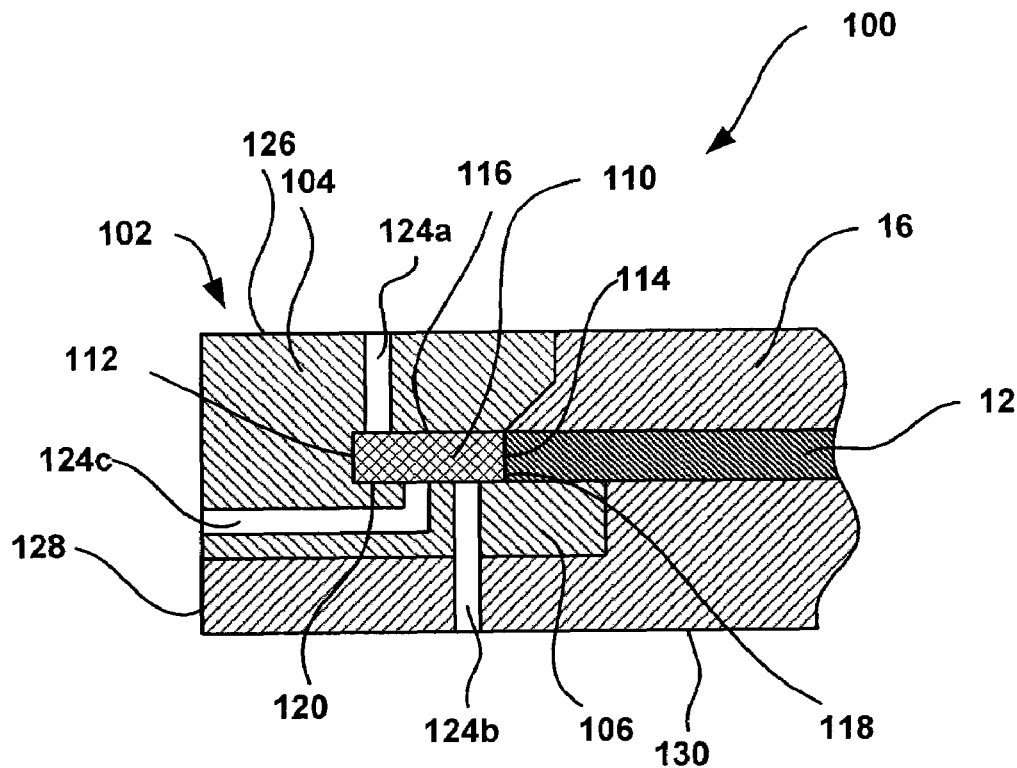
FIGS. 3A-3B are cross-sectional views of a described embodiment of an acoustic transducer module.
Figure 3B:
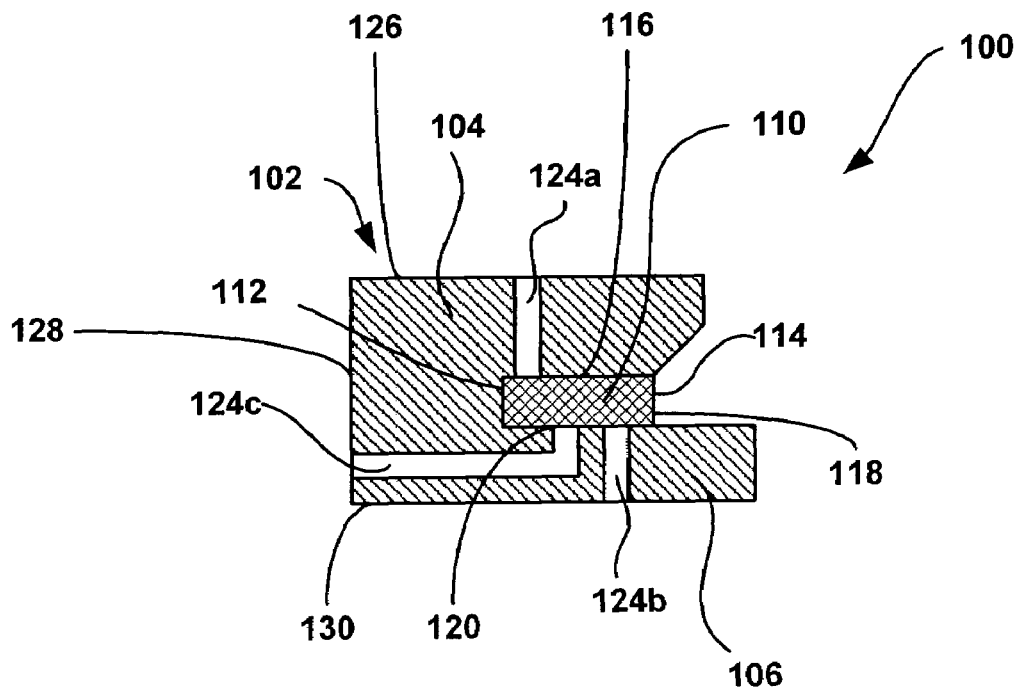

Referring now to FIGS. 3A-3B a module 100 in accordance with a described embodiment of the invention can be used in a communication device, including devices similar to the cellular phone 14 illustrated in FIG. 1. The module 100 may include a housing 102 including a top housing section 104 and a bottom housing section 106. The top housing section 104 and the bottom housing section 106 may be joined together by mechanical fastening, crimping, welding or adhesive bonding, for instance. The housing 102 is shown to have at least one layer; however, the housing 102 may utilize alternating layers of conductive and/or non-conductive materials and such embodiment will be discussed in greater detail. In the embodiment shown, the housing 102 is made of polymeric material such as molded plastic material.

The module 100 further includes a surface mountable component 110, a substrate (not shown), and a retaining structure 112. The surface mountable component (SMC) 110 may include a micro-electromechanical system (MEMS) device, e.g. a transducer or silicon-based microphone such as the silicon condenser microphone disclosed in U.S. Pat. No. 5,870,482; U.S. patent application Ser. No. 09/886,754; International Patent Application PCT/US0148462; and/or U.S. patent application Ser. No. 10/238,256, the disclosures of which are herein incorporated by reference in their entirely for all purposes. In the embodiment shown, the SMC 110 is a MEMS based, miniature silicon condenser microphone. The SMC 110 may be molded within the housing 102 or fit or molded within the retaining structure 112 formed within the housing 102.

The SMC 110 includes a connecting surface 114 for electrically connecting with a printed circuit board (PCB) 12 within the communication device or to otherwise electrically couple the SMC 110 to the communication device. The connecting surface 114 can be located on an upper surface 116, a side surface 118, or a bottom surface 120 of the SMC 110. The connecting surface 114 may be electrically coupled to the PCB via a soldering process; however, it will be understood by those skilled in the art that any form of electrical connection would suffice, including conductive adhesive, contacts, spring-loaded contacts, plugs, and the like. The module 100 may further include a secondary mounting structure that is electrically coupled to the connecting surface 114 and such embodiment will be discussed in greater detail. In the embodiment shown, the connecting surface 114 is located on the side surface 118 of the SMC 110 for electrically coupling the SMC 110 with the PCB 12 within the device 14.

The acoustic port 124 may be formed by a number of methods, including drilling through the housing 102 to form an acoustic pathway to the SMC 110 or molding the acoustic port 124 into the housing 102. Alternatively, a port may be formed, such as by drilling, completely through the housing 102, the device PCB and outer housing to allow acoustic energy to be coupled to the SMC 110.

The module 100 is capable of withstanding relatively high temperatures including those associated with various plastic molding processes. The module 100 may therefore be mounted within or mated to the device 14 during a plastic molding process used to produce the device housing 16. Doing so provides the advantages of reduced overall size of the device while maintaining good electroacoustic performance such as sensitivity, noise, stability, compactness, robustness, and insensitivity to electromagnetic interference (EMI) and other external and environmental conditions (including shock and debris).

The module 100 is capable of withstanding relatively high temperatures including those associated with various plastic molding processes. The module 100 may therefore be mounted within or mated to the device 14 during a plastic molding process used to produce the device housing 16. Doing so provides the advantages of reduced overall size of the device while maintaining good electroacoustic performance such as sensitivity, noise, stability, compactness, robustness, and insensitivity to electromagnetic interference (EMI) and other external and environmental conditions (including shock and debris).

Figure 4A:
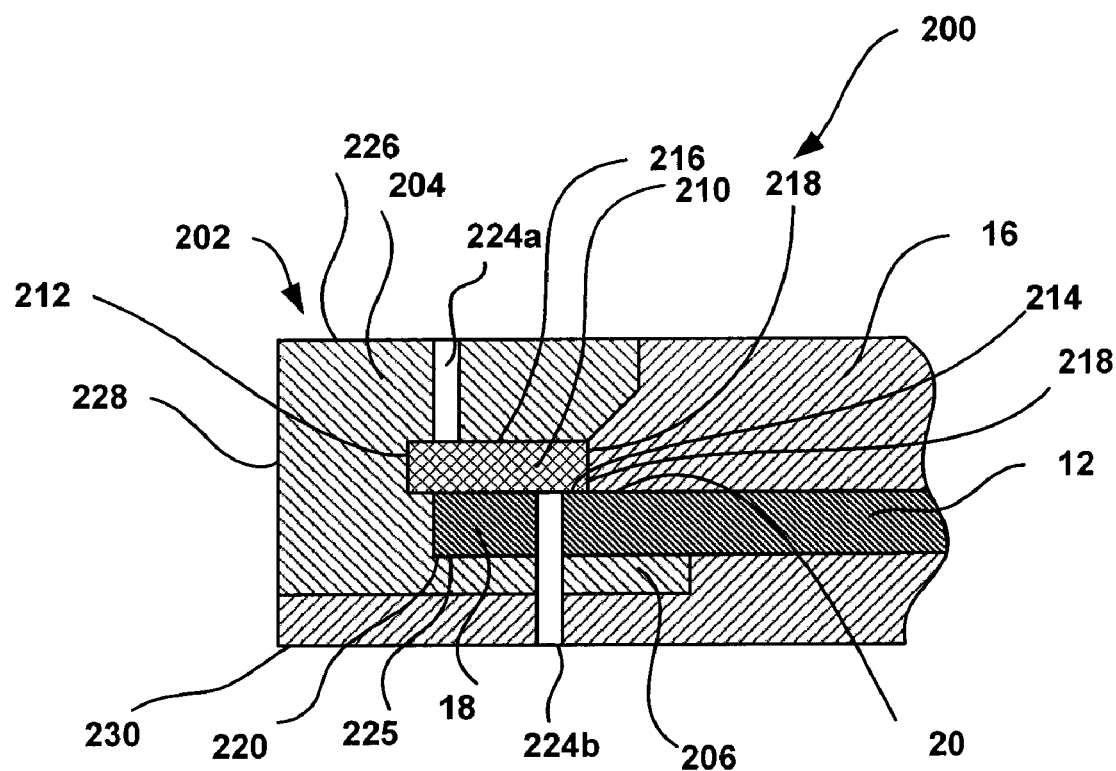
FIGS. 4A-4B are cross-sectional views of another described embodiment of an acoustic transducer module.
Figure 4B:
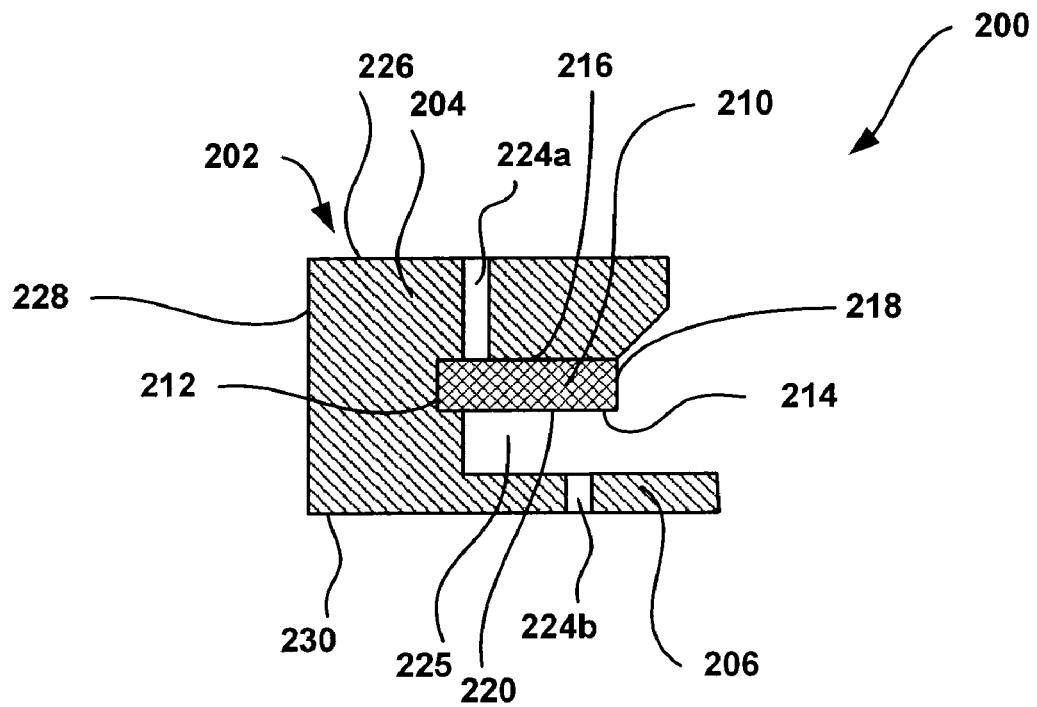

Referring now to FIGS. 4A-4B a module 200 in accordance with a described embodiment of the invention can be used in communication device, including devices similar to the device 14 illustrated in FIG. 1. The module 200 is similar in construction and function as the module 100 illustrated in FIGS. 3A and 3B, and like elements are referred to using like reference numerals wherein, for example, 100 and 102 correspond to 200 and 202, respectively. The module 200 may include a housing 202 including a top housing section 204 and a bottom housing section 206. The top housing section 204 and the bottom housing section 206 may be joined together by mechanical fastener, crimping, welding or adhesive bonding, for instance. The housing 202 is shown to have at least one layer; however, the housing 202 may utilize alternating layers of conductive and/or non-conductive materials and such embodiment will be discussed in greater detail. In the embodiment shown, the housing 202 is made of polymeric material such as molded plastic material.

The module 200 further includes a surface mountable component 210, a substrate (not shown) and a retainer structure 212. The surface mountable component (SMC) 210 may include a micro-electromechanical system (MEMS) device, e.g. a transducer or silicon-based microphone such as the silicon condenser microphone disclosed in afore-mentioned U.S. Pat. No. 5,870,482; U.S. patent application Ser. No. 09/886,754; International Patent Application PCT/US0148462; and/or U.S. patent application Ser. No. 10/238,256. In the embodiment shown, the SMC 210 is a MEMS based, miniature silicon condenser microphone. The SMC 210 may be molded within the housing 202 or fit or molded within the retainer structure 212 formed within the housing 202.

The module 200 further includes a surface mountable component 210, a substrate (not shown) and a retaining structure 212. The surface mountable component (SMC) 210 may include a micro-electromechanical system (MEMS) device, e.g. a transducer or silicon-based microphone such as the silicon condenser microphone disclosed in afore-mentioned U.S. Pat. No. 5,870,482; U.S. patent application Ser. No. 09/886,754; International Patent Application PCT/US0148462; and/or U.S. patent application Ser. No. 10/238,256. In the embodiment shown, the SMC 210 is a MEMS based, miniature silicon condenser microphone. The SMC 210 may be molded within the housing 202 or fit or molded within the retaining structure 212 formed within the housing 202.

The SMC 210 includes a connecting surface 214 for electrically connecting with a printed circuit board (PCB) 12 within the communication device or to otherwise electrically couple the SMC 210 to the communication device. The connecting surface 214 can be located on an upper surface 216, a side surface 218, or a bottom surface 220 of the SMC 210. The connecting surface 214 may be electrically coupled to the PCB via a soldering process; however, it will be understood by those skilled in the art that any form of electrical connection would suffice, including conductive adhesive, contacts, spring-loaded contacts, plugs, and the like. The module 200 may further include a secondary mounting structure that is electrically coupled to the connecting surface 214 and such embodiment will be discussed in greater detail. In the embodiment shown, the connecting surface 214 is located on the bottom surface 220 of the SMC 210 for electrically coupling the SMC 210 with the PCB 12 within the device 14.

The acoustic port 224 may be formed by a number of methods, including drilling or molding through the housing 202 to form an acoustic pathway to the SMC 210. Alternatively, a port may be formed, such as by drilling, completely through the housing 202, the device PCB and outer housing to allow acoustic energy to be coupled to the SMC 210.

The module 200 is capable of withstanding relatively high temperatures including those associated with various plastic molding processes. The module 200 may therefore be mounted within or mated to the device during a plastic molding process used to produce the device housing. Doing so provides the advantages of reduced overall size of the device while maintaining good electro-acoustic performance such as sensitivity, noise, stability, compactness, robustness, and insensitivity to electromagnetic interference (EMI) and other external and environmental conditions (including shock and debris).

The module 200 is capable of withstanding relatively high temperatures including those associated with various plastic molding processes. The module 200 may therefore be mounted within or mated to the device during a plastic molding process used to produce the device housing. Doing so provides the advantages of reduced overall size of the device while maintaining good electro-acoustic performance such as sensitivity, noise, stability, compactness, robustness, and insensitivity to electromagnetic interference (EMI) and other external and environmental conditions (including shock and debris). As shown in FIG. 4A, the combination of the housing 202, the PCB 12, and the housing 16 of the device 14 creates the second acoustic port 224b and are in alignment with the SMC 210 for delivering acoustic energy to the SMC 210. The first acoustic port 224a located on the upper surface 216 of the housing 202 and is acoustically coupled to the SMC 210.

As shown in FIG. 4A, the module 200 is electrically connected such as by soldering to the PCB 12 within the device 14. Alternately, FIG. 4B shows the module 200 may be mechanically or frictionally joined within the retaining structure 212 formed within the housing 16 of the device 14. In the illustrated embodiment, an extension portion 18 of the PCB 12 extends into and is locked within a relief structure 225. A surface 20 of the PCB 12 is pressed into contact with the connection surface 214 electrically coupling the module 200 to the PCB 12. Alternative methods such as fasteners, frictional connectors, snap fit, tongue and groove assemblies, that may or may not be formed as a portion of the external surface or outer housing 16 of the device 14, may be used to secure the module 200 to the device. It will be further understood by those skilled in the art that bonding and similar forms of joining, such as epoxy, tape and the like, may be used. The housing 202 of the module 200 may be colored and/or textured with a smooth polished surface including a beveled edge, dimples, or the like to match the external surface or outer housing 16 of the device 14.

As shown in FIG. 4A, the combination of the housing 202, the PCB 12, and the housing 16 of the device 14 creates the second acoustic port 224b and are in alignment with the SMC 210 for delivering acoustic energy to the SMC 210. The first acoustic port 224a located on the upper surface 216 of the housing 202 and is acoustically coupled to the SMC 210.

The SMC 310 may be affixed to the housing 302 by providing a layer of epoxy 332 such as a B-staged epoxy around the SMC 310 to form a gasket seal; however, it will be understood by those skilled in the art that other methods for affixing the SMC 310 are possible. In the embodiment shown, the gasket 332 is formed at least to prevent leakage of acoustic waves from the acoustic pathway coupling the SMC 310 to the outside of the housing 302.

Figure 5A:
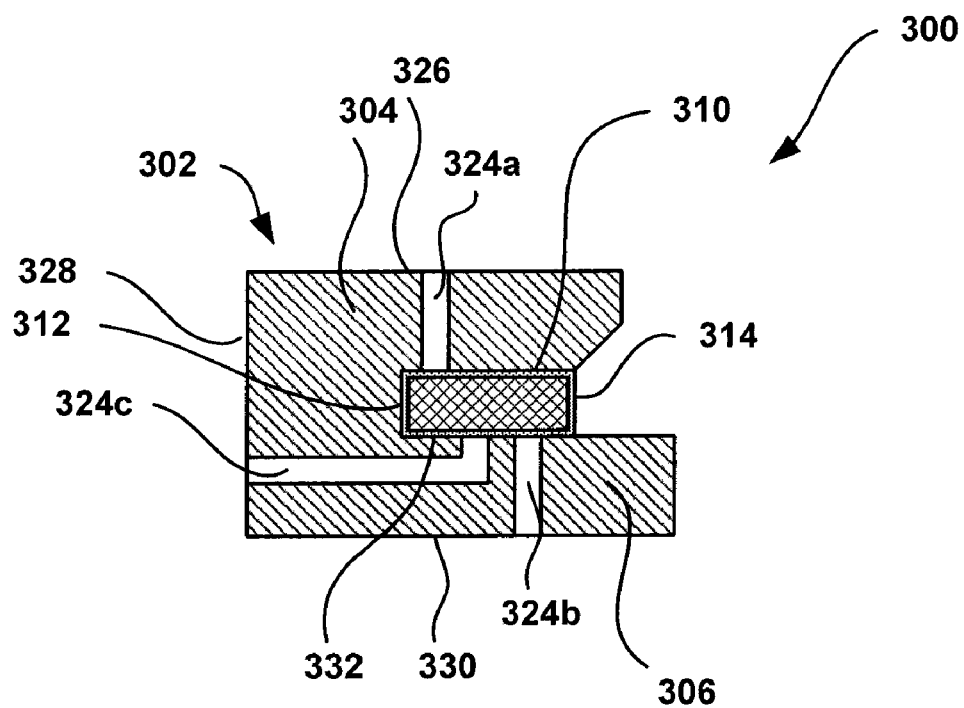
FIGS. 5A-5B are cross-sectional views of another described embodiment of an acoustic transducer module.
Figure 5B:
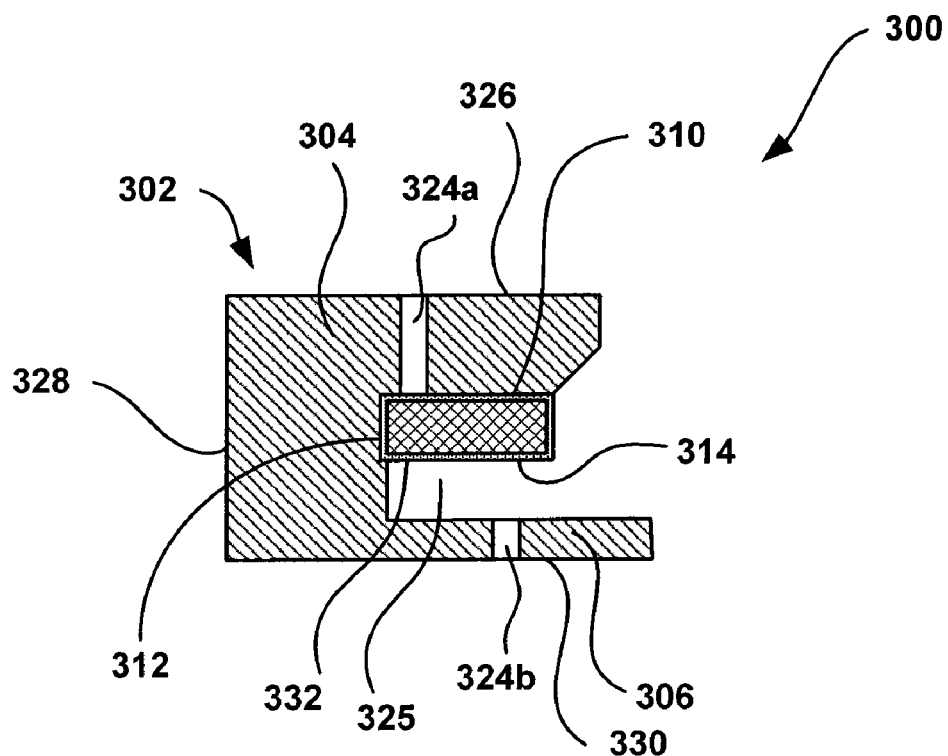

At least one aperture or acoustic port, three are illustrated as ports 324a, 324b and 324c in FIG. 5A and two 324a and 324b are illustrated in FIG. 5b, is introduced on the surface of the housing 302 to allow acoustic waves to enter. For simplicity, when referring to the one or more acoustic ports reference will be made to acoustic port 324 with the understanding the one or more such ports may be provided. Multiple acoustic ports provide a directional sensitivity capability in the SMC 310. The acoustic port 324 can be formed on the upper surface 326, side surface 328 or bottom surface 330 of the housing 302, or in multiple locations on these surfaces. In the embodiment shown, the first acoustic port 324a is located on the upper surface 326, the second acoustic port 324b is located on the bottom surface 330, and the third acoustic port 324c is located on the side surface 328 to provide directional characteristics, i.e., omni-directional, bi-directional, or uni-directional sensitivity in the SMC 310.

The SMC 310 may be affixed to the housing 302 by providing a layer of epoxy 332 such as a B-staged epoxy around the SMC 310 to form a gasket seal; however, it will be understood by those skilled in the art that other methods for affixing the SMC 310 are possible. In the embodiment shown, the gasket 332 is formed at least to prevent leakage of acoustic waves from the acoustic pathway coupling the SMC 310 to the outside of the housing 302.

The module 300 may be electrically connected such as by soldering to the PCB 12 within the device 14. Alternately, FIG. 5B shows that the module 300 may be mechanically or frictionally joined within a retaining structure 312. Alternative methods such as fasteners, frictional connectors, snap fit, tongue and groove assemblies, that may or may not be formed as a portion of the external surface or outer housing 16 of the device 14, may be used to secure the module 300 to the device. It will be further understood by those skilled in the art that boding and similar forms of joining, such as epoxy, tape and the like, may be used. The housing 302 of the module 300 may be colored and/or textured with a smooth polished surface including a beveled edge, dimples, or the like to match the external surface or outer housing 16 of the device 14.

Figure 6A:
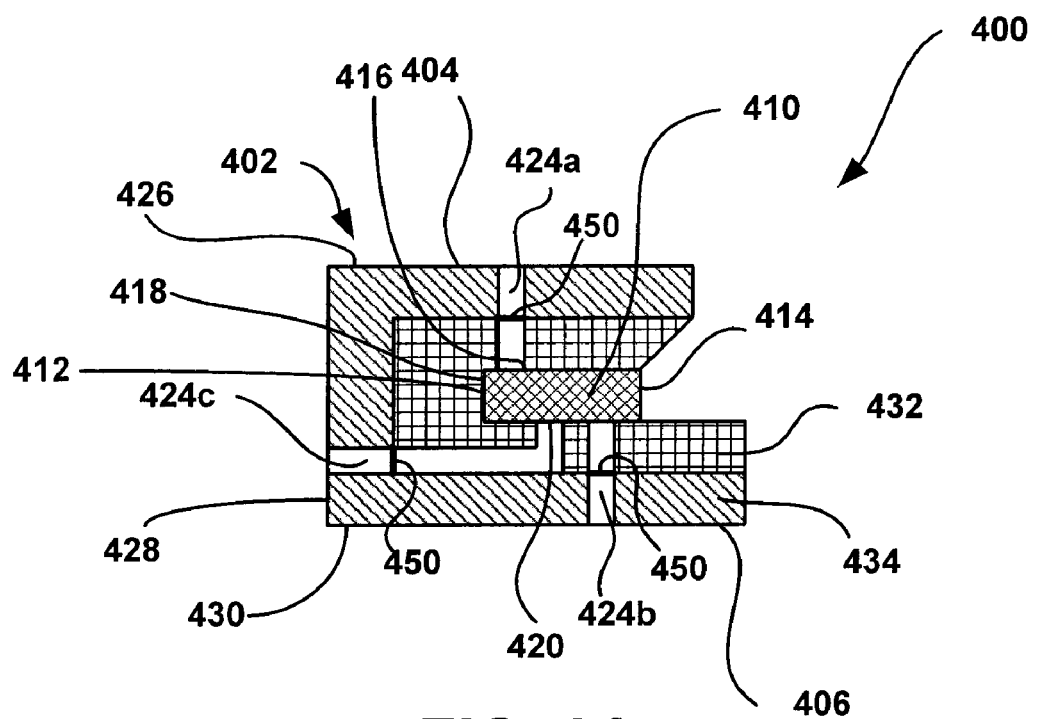
FIGS. 6A-6C are cross-sectional views of another described embodiment of an acoustic transducer module.
Figure 6B:
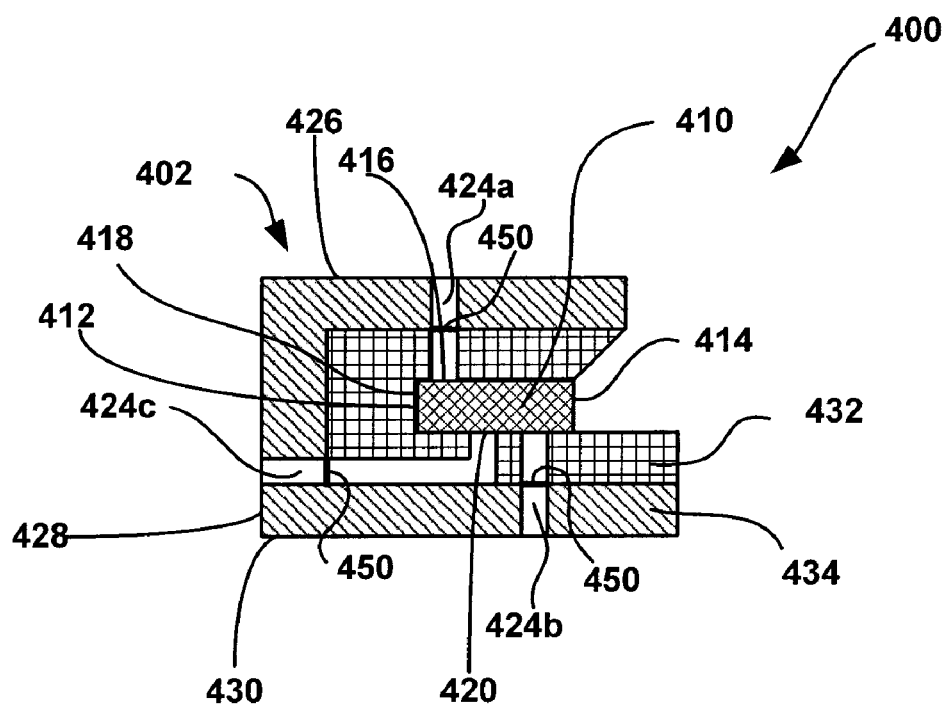
Figure 6C:
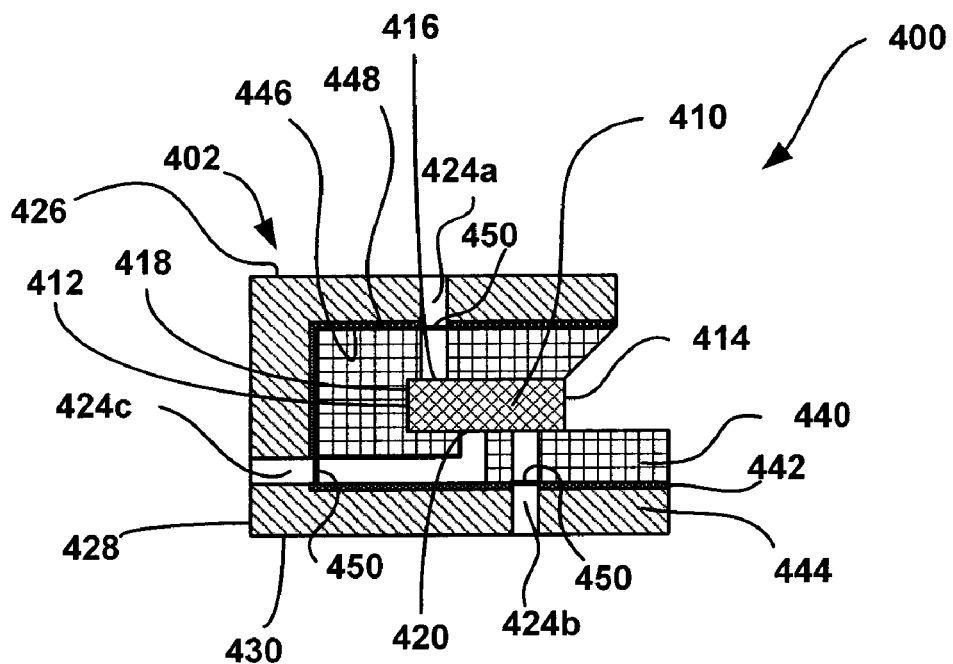

Referring now to FIGS. 6A-6C a module 400 in accordance with a described embodiment of the invention can be used in communication device, including devices similar to the device 14 illustrated in FIG. 1. The module 400 is similar in construction and function as the module 100 illustrated in FIGS. 3A and 3B, and like elements are referred to using like reference numerals wherein, for example, 100 and 102 correspond to 400 and 402, respectively.

The housing 402 is shown to have at least two layers 432 and 434, wherein layer 432 is an inner layer and layer 434 is an outer layer. The inner layer 432 is attached to the outer layer 434 for example, by bonding with adhesive, compression, or mechanical attachment. In one example, the inner layer 432 is made of polymeric material such as a molded plastic material and the outer layer 434 is made of polymeric material such as a molded plastic material that may be the same as or different than the polymeric material used to form the inner layer 432.

As illustrated in FIG. 6C, the housing 402 is made of a first layer 440, a second layer 442, and a third layer 444. The first layer 440 is attached on a surface 446 of the second layer 442 for example, by bonding with adhesive, compression, or mechanical attachment. The third layer 444 is attached on a surface 448 of the second layer 442 for example, by bonding with adhesive, compression, or mechanical attachment. In one example, the first and third layers 440 and 444 are made of polymeric material such as a molded plastic material and the second layer 442 is made of conductive material such as copper. The second layer 442 may be formed between the first layer 440 and the third layer 442 to protect the SMC 400 within the housing 400 against electromagnetic interference and the like.

The housing 402 is shown to have at least two layers 432 and 434, wherein layer 432 is an inner layer and layer 434 is an outer layer. The inner layer 432 is attached to the outer layer 434 for example, by bonding with adhesive, compression, or mechanical attachment. In one example, the inner layer 432 is made of polymeric material such as a molded plastic material and the outer layer 434 is made of polymeric material such as a molded plastic material that may be the same as or different than the polymeric material used to form the inner layer 432.

At least one aperture or acoustic port, three are illustrated as ports 424a, 424b and 424c, is introduced on the surface of the housing 402 to allow acoustic waves to enter. For simplicity, when referring to the one or more acoustic ports reference will be made to acoustic port 424 with the understanding the one or more such ports may be provided. Multiple acoustic ports provide a directional sensitivity capability in the SMC 410. The acoustic port 424 can be formed on the upper surface 416, side surface 418 or bottom surface 420 of the housing 402, or in multiple locations on these surfaces. In the embodiment shown, the first acoustic port 424a is located on the upper surface 416, the second acoustic port 424b is located on the bottom surface 420, and the third acoustic port 424c is located on the side surface 418 to provide directional characteristics, i.e., omni-directional, bi-directional, or uni-directional sensitivity in the SMC 410.

The acoustic port 424 may be formed by a number of methods, including drilling or molding through the housing 402 to form an acoustic pathway to the SMC 410. Alternatively, a port may be formed, such as by drilling, through the housing 402, the device PCB and outer housing to allow acoustic energy to be coupled to the SMC 410.

At least one aperture or acoustic port, three are illustrated as ports 424a, 424b and 424c, is introduced on the surface of the housing 402 to allow acoustic waves to enter. For simplicity, when referring to the one or more acoustic ports reference will be made to acoustic port 424 with the understanding the one or more such ports may be provided. Multiple acoustic ports provide a directional sensitivity capability in the SMC 410. The acoustic port 424 can be formed on the upper surface 426, side surface 428 or bottom surface 430 of the housing 402, or in multiple locations on these surfaces. In the embodiment shown, the first acoustic port 424a is located on the upper surface 426, the second acoustic port 424b is located on the bottom surface 430, and the third acoustic port 424c is located on the side surface 428 to provide directional characteristics, i.e., omni-directional, bi-directional, or uni-directional sensitivity in the SMC 410.

Figure 7A:
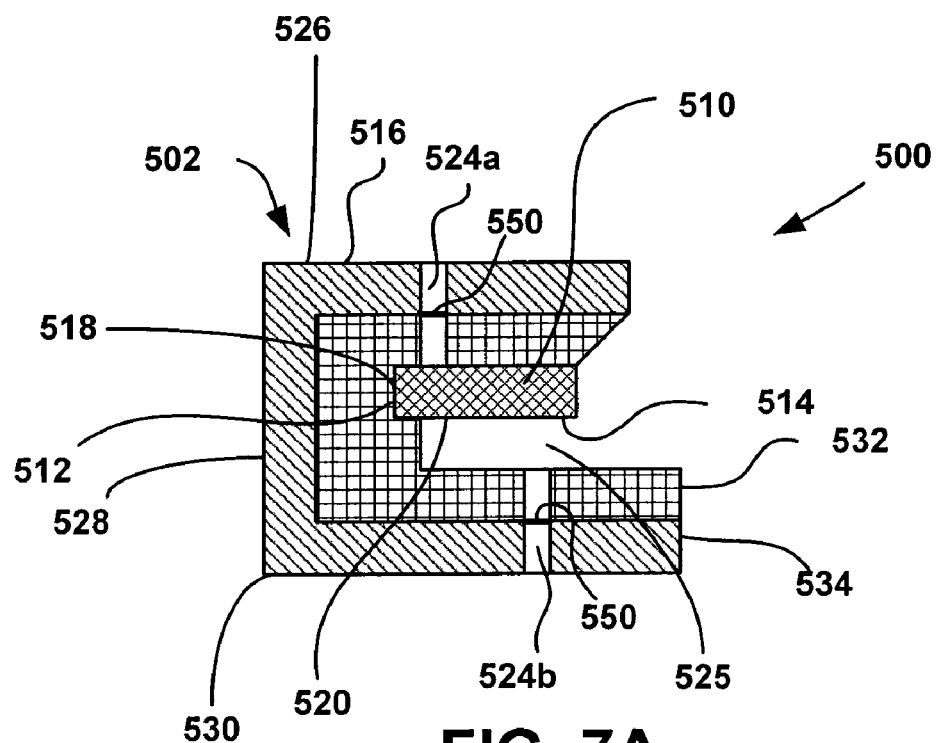
FIGS. 7A-7C are cross-sectional views of another described embodiment of an acoustic transducer module.
Figure 7B:
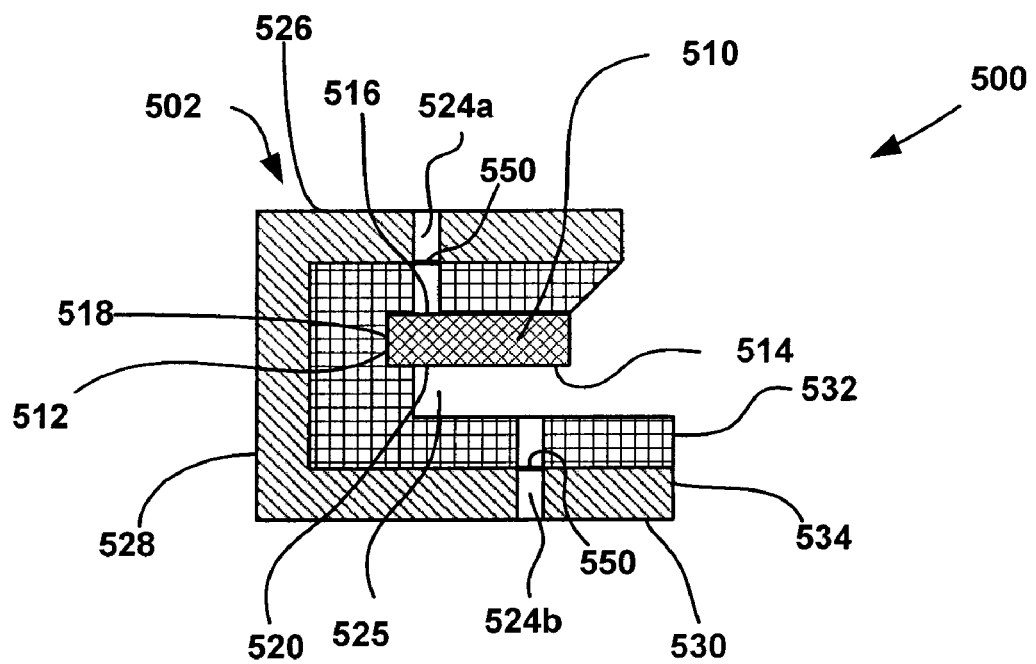
Figure 7C:
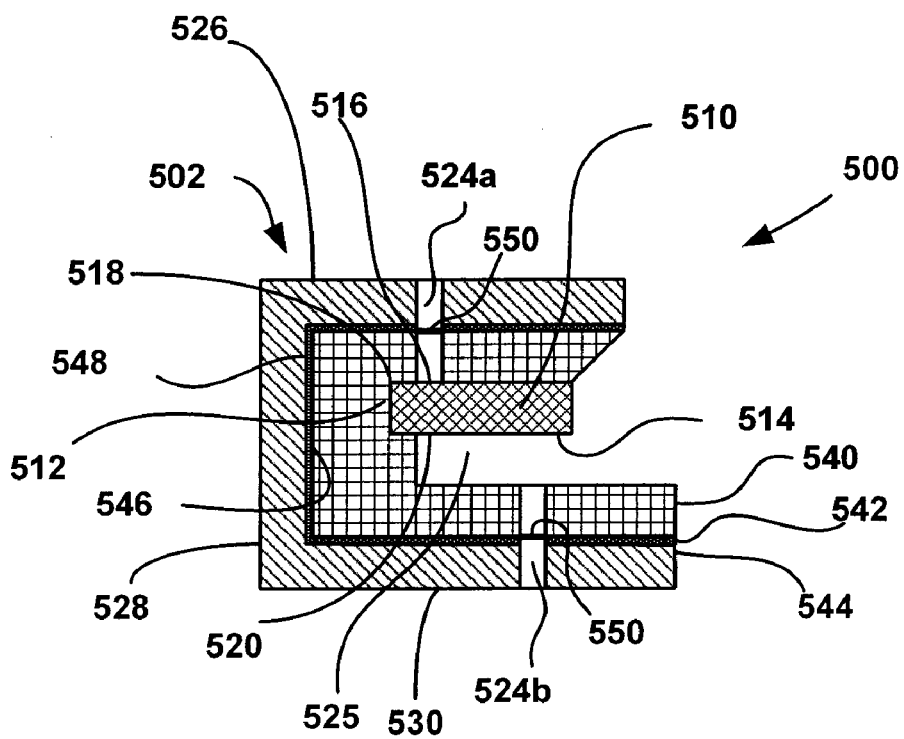

Referring now to FIGS. 7A-7B a module 500 in accordance with a described embodiment of the invention can be used in communication device, including devices similar to the device 14 illustrated in FIG. 1. The module 500 is similar in construction and function as the module 100 illustrated in FIGS. 3A and 3B, and like elements are referred to using like reference numerals wherein, for example, 100 and 102 correspond to 500 and 502, respectively.

An environmental barrier layer 450 that may be made of a flat plastic sheet, e.g., polymeric material film such as polytetrafluoroethylene (PTFE) or a sintered metal is adhered to cover the acoustic ports 424a, 424b, 424c to prevent debris from entering the module 400 and damaging the SMC 410 and the retaining structure 412 disposed within the housing 402. The environmental barrier layer 450 may further be selected to have acoustic properties, such as acoustic resistive properties, to improve the frequency response, create delay and provide directional response. The SMC 510 may include a connecting surface 514 for electrically connecting with a printed circuit board (PCB) 12 of the device 14. The connecting surface 514 can be located on an upper surface 516, a side surface 518 or a bottom surface 520 of the SMC 510. The connecting surface 514 may be attached to the PCB via a soldering process; however, it will be understood by those skilled in the art that any form of electrical connection would suffice, including contacts, spring-loaded contacts, plugs, and the like. The module 500 may include a relief structure 525 adapted to receive an extension portion 18 of the PCB 12 for mechanically securing and electrically coupling the module 500 to the PCB 12. In the embodiment shown, the connecting surface 514 is located on the bottom surface 520 of the SMC 510 for electrically connecting with the PCB 12 of the device 14.

At least one aperture or acoustic port, two are illustrated as ports 524a and 524b, is introduced on the surface of the housing 502 to allow acoustic waves to enter. For simplicity, when referring to the one or more acoustic ports reference will be made to acoustic port 524 with the understanding the one or more such ports may be provided. Multiple acoustic ports provide a directional sensitivity capability in the SMC 510. The acoustic port 524 can be formed on the upper surface 526, side surface 528 or bottom surface 530 of the housing 502, or in multiple locations on these surfaces. In the embodiment shown, the first acoustic port 524a is located on the upper surface 526 and the second acoustic port 524b is located on the bottom surface 530 to provide directional characteristics, i.e., omni-directional, bi-directional, or uni-directional sensitivity in the SMC 410.

The acoustic port 524 may be formed by a number of methods, including drilling for molding through the housing 502 to form an acoustic pathway to the SMC 510 (FIGS. 7A-7B). Alternatively, a port may be formed, such as by drilling, through the housing 502, the device PCB and outer housing to allow acoustic energy to be coupled to the SMC 510.

The SMC 510 may include a connecting surface 514 for electrically connecting with a printed circuit board (PCB) 12 of the device 14. The connecting surface 514 can be located on an upper surface 516, a side surface 518 or a bottom surface 520 of the SMC 510. The connecting surface 514 may be attached to the PCB via a soldering process; however, it will be understood by those skilled in the art that any form of electrical connection would suffice, including contacts, spring-loaded contacts, plugs, and the like. The module 500 may include a relief structure 525 adapted to receive an extension portion 18 of the PCB 12 for mechanically securing and electrically coupling the module 500 to the PCB 12. In the embodiment shown, the connecting surface 514 is located on the bottom surface 520 of the SMC 510 for electrically connecting with the PCB 12 of the device 14.

Figure 8:
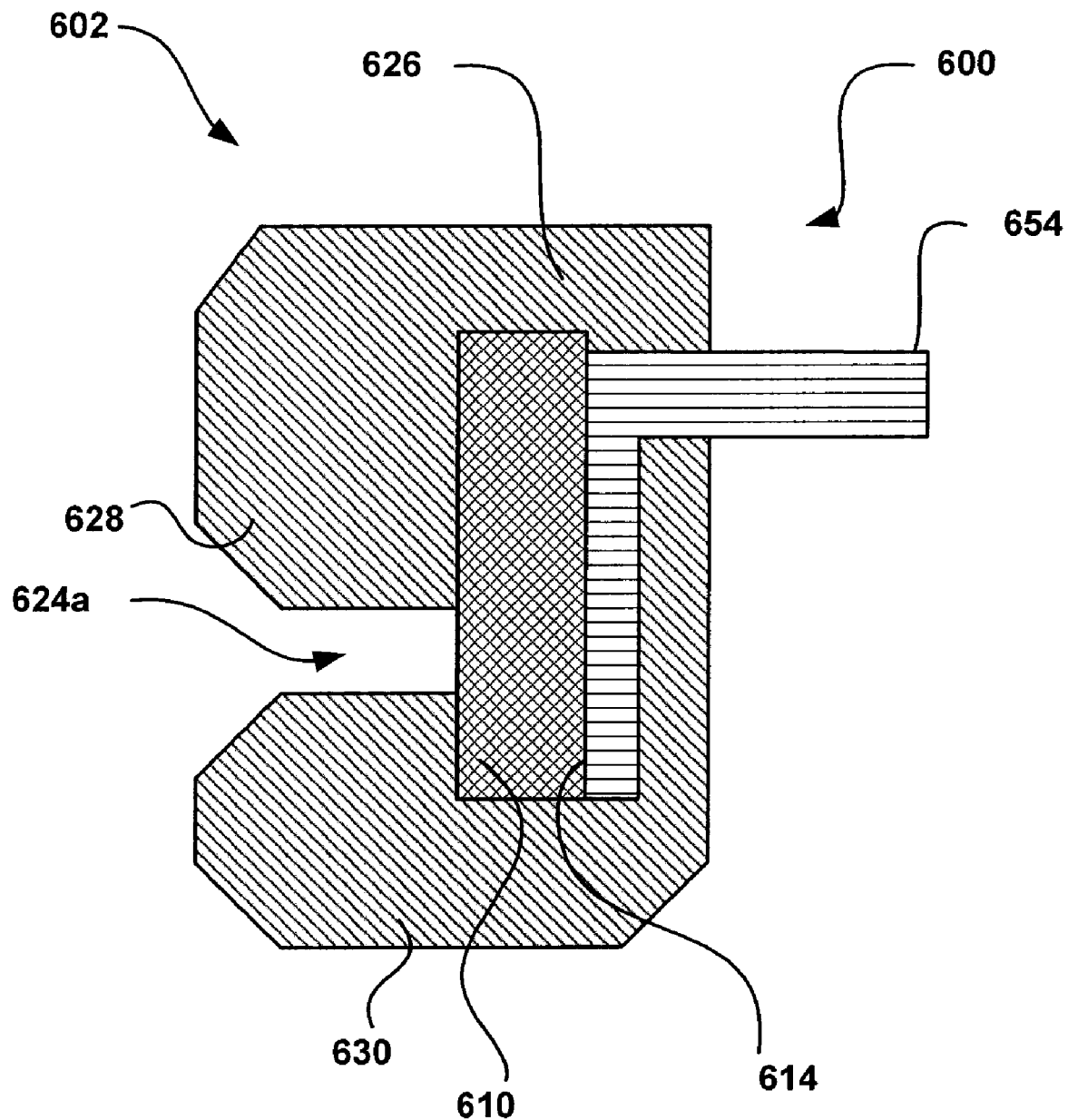
FIG. 8 is a cross-sectional view of another described embodiment of an acoustic transducer module.

Referring now to FIG. 8 a module 600 in accordance with a described embodiment of the invention can be used in communication device, including devices similar to the device 14 illustrated in FIG. 1. The module 600 is similar in construction and function as the module 100 illustrated in FIGS. 3A and 3B, and like elements are referred to using like reference numerals wherein, for example, 100 and 102 correspond to 600 and 602, respectively. The module 600 may further include a secondary mounting structure 654 that is electrically connected to the connecting surface 614 of the SMC 610. The secondary mounting structure 654 may be a flex circuit, lead frame, or the like, for instance. The secondary mounting structure 654 may or may not be molded within the housing 602. In this example, the secondary mounting structure 654 is introduced to allow the SMC 610 to be mounted or molded within the housing 602 in a variety of orientations relative to the PCB 18 disposed within the device 14.

At least one aperture or one acoustic port, one illustrated as port 624a, is introduced on the surface of the housing 602 to couple acoustic waves to SMC 610. The acoustic port 624a can be formed on the upper surface 626, the side surface 628 or the bottom surface 630 of the housing 602, or in multiple locations on the upper, bottom and/or side surfaces of the housing 602. In the embodiment shown, the first acoustic port 624a is located on the side surface 628 of the housing 602.

The module 600 may be mounted or mated within the device 14 during the plastic molding process used to form the housing 602 to reduce the overall size of the device 14 and yet maintain good electro-acoustic performance such as sensitivity, noise, stability, compactness, robustness, and insensitivity to electromagnetic interference (EMI) and other external and environmental conditions (including shock and debris). However, it will be understood by those skilled in the art that any form of electrical connection would suffice.

Figure 9:
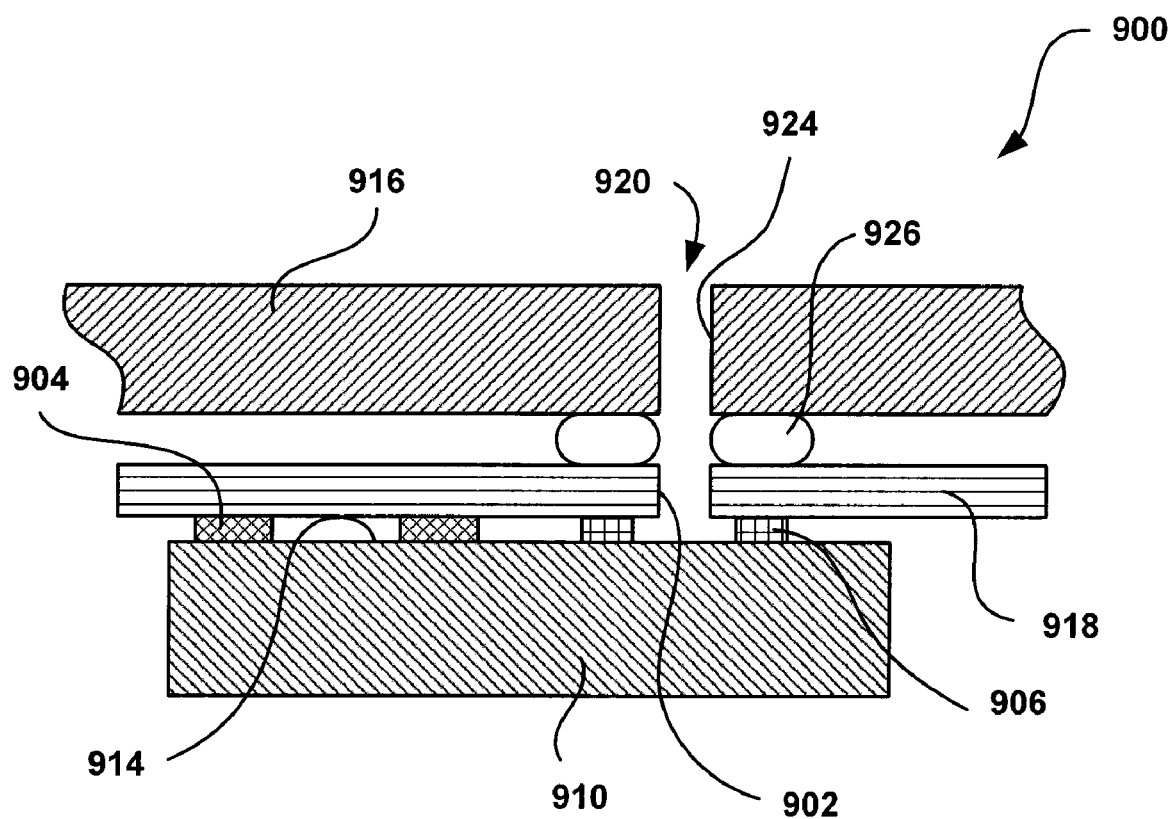
FIG. 9 is a partial cross-sectional view of another described embodiment of an acoustic transducer module.

Referring now to FIG. 9, a module 900 includes a surface mountable transducer or component (SMC) 910 having a connecting surface 914 coupled electrically to a printed circuit board (PCB) 918 by solder pads 904 formed on the connecting surface 914 of the SMC 910. The SMC 910 may be soldered or bonded by conductive adhesive to corresponding conductive traces formed in the PCB 918. The SMC 910 includes an aperture (not depicted) formed in the connecting surface 914 permitting sound energy to enter the SMC 910 or alternatively to permit sound energy generated by the SMC 910 to exit the SMC 910. Thus, the surface 914 is adapted to be exposed to the exterior of the device in which the module 900 is used. As shown, the aperture will be aligned with an aperture 902 formed in the PCB 918. An acoustic solder or epoxy seal 906 may be formed around the aperture 902.

The SMC 910 and PCB 918 may be fitted within a communication device, including devices similar to the device 14 illustrated in FIG. 1. In this manner, the SMC 910 and the PCB 918 may form the module 900, similar in construction and function as the module 100 illustrated in FIGS. 3A-3C. Still, the SMC 910 mounted to the PCB 918 as the module 900 may be standalone component.

The communication device includes a housing or case a portion of which is shown as 916 that is formed with an aperture 924. An acoustic seal 926, such as an elastomer acoustic seal may be provided to seal the case 916 to the PCB 918. In this manner, an acoustic path 920 from the SMC 910 through the PCB 918 via the aperture 902 to the exterior of the case 916 via the aperture 924 is formed within the communication device coupling the SMC 910 to the exterior of the communication device.

Referring now to FIG. 9, a module 900 includes a surface mountable transducer or component (SMC) 910 having a connecting surface 914 coupled electrically to a printed circuit board (PCB) 918 by solder pads 904 formed on the connecting surface 914 of the SMC 910. The SMC 910 may be soldered or bonded by conductive adhesive to corresponding conductive traces formed in the PCB 918. The SMC 910 includes an aperture (not depicted) formed in the connecting surface 914 permitting sound energy to enter the SMC 910 or alternatively to permit sound energy generated by the SMC 910 to exit the SMC 910. Thus, the connecting surface 914 is adapted to be exposed to the exterior of the device in which the module 900 is used. As shown, the aperture will be aligned with an aperture 902 formed in the PCB 918. An acoustic solder or epoxy seal 906 may be formed around the aperture 902.

The SMC 910 and PCB 918 may be fitted within a communication device, including devices similar to the device 14 illustrated in FIG. 1. In this manner, the SMC 910 and the PCB 918 may form the module 900, similar in construction and function as the module 100 illustrated in FIGS. 3A-3C. Still, the SMC 910 mounted to the PCB 918 as the module 900 may be standalone component.

The communication device includes a housing or case a portion of which is shown as 916 that is formed with an aperture 924. An acoustic seal 926, such as an elastomer acoustic seal may be provided to seal the case 916 to the PCB 918. In this manner, an acoustic path 920 from the SMC 910 through the PCB 918 via the aperture 902 to the exterior of the case 916 via the aperture 924 is formed within the communication device coupling the SMC 910 to the exterior of the communication device.

In this regard, a portion of the connecting surface 914 may be adapted to be exposed to the exterior of the case 916, and hence form a portion of the housing 916 of the communication device. To protect the interior of the SMC 910, the aperture 924 of 902 formed therein may include an environmental barrier (not shown). The environmental barrier may be a flat plastic sheet, e.g., a polymeric material film such as polytetrafluoroethylene (PTFE) or a sintered metal adhered to the connecting surface 914 or formed as part of the wall of the SMC 910 defining the connecting surface 914.

A device constructed in accordance with one or more of the described embodiments enjoy many advantages over the known devices. For example, a module, such as module 100, 200, 300, 400, 500, 600 or 900 may be mounted to a PCB disposed within a housing of the device or may be a plug-in type unit, for instance. The module may be adapted for use in virtually any type of electronic device and especially electronic communication devices such a cellular telephones, personal digital assistants, and the like.

The use of the terms "a" and "an" and "the" and similar referents in the context of describing the invention (especially in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. It should be understood that the illustrated embodiments are exemplary only, and should not be taken as limiting the scope of the invention.

What is claimed is:

1. An electronic device comprising:
   a transducer;
   a printed circuit board having a first surface and a second surface;
   an electronic device housing having a cavity and a sound aperture for permitting the cavity to communicate with an exterior of the cavity, the transducer disposed in the cavity; and
   an acoustic pathway penetrating the first surface to the second surface to permit the transducer to communicate with the exterior of the cavity;
   wherein the first surface of the printed circuit board is attached to the transducer and forms a portion of the transducer; and wherein the second surface of the printed circuit board is attached to the electronic device housing and forms a portion of the electronic device housing.

2. The electronic device of claim 1, further comprising a structure surrounding the acoustic pathway, the structure forming a portion of the transducer.

3. The electronic device of claim 2, wherein the structure is an environmental barrier configured to constrain moisture and debris from entry into the sound aperture.

4. The electronic device of claim 2, wherein the structure is an acoustic seal for preventing leakage of acoustic waves from the acoustic pathway to the exterior of the cavity.

5. An electronic device comprising:
   a transducer having a transducer housing;
   a printed circuit board having a first surface and a second surface; and
   an electronic device housing having a cavity and a sound aperture to permit the cavity to communicate with an exterior of the cavity, the transducer disposed in the cavity;
   wherein the first surface of the printed circuit board is attached to the transducer and forms a portion of the transducer, and wherein the transducer housing forming a portion of the electronic device housing and allowing acoustic waves to communicate with the transducer via the sound aperture, and the electronic device housing is formed on the first surface of the printed circuit.

6. The electronic device of claim 5, further comprising an acoustic pathway penetrating the first surface to the second surface of the printed circuit board for permitting the transducer to communicate with the exterior of the cavity.

7. The electronic device of claim 6, further comprising a structure surrounding the acoustic pathway, the structure forming a portion of the transducer.

8. The electronic device of claim 7, wherein the structure is an environmental barrier configured to constrain moisture and debris from entry into the sound aperture.

9. The electronic device of claim 7, wherein the structure is an acoustic seal for preventing leakage of acoustic waves from the acoustic pathway to the exterior of the cavity.

* * * * *

UNITED STATES PATENT AND TRADEMARK OFFICE
CERTIFICATE OF CORRECTION

| | | |
|---|---|---|
| PATENT NO. | : 7,633,156 B2 | |
| APPLICATION NO. | : 12/112970 | |
| DATED | : December 15, 2009 | |
| INVENTOR(S) | : Minervini | |

It is certified that error appears in the above-identified patent and that said Letters Patent is hereby corrected as shown below:

Claim 5, Column 12, Line 37, delete "circuit." and insert -- circuit board. --, therefor.

Signed and Sealed this
Twenty-second Day of November, 2011

David J. Kappos
*Director of the United States Patent and Trademark Office*